(12) United States Patent
Wang et al.

(10) Patent No.: US 8,742,518 B2
(45) Date of Patent: *Jun. 3, 2014

(54) MAGNETIC TUNNEL JUNCTION WITH FREE LAYER HAVING EXCHANGE COUPLED MAGNETIC ELEMENTS

(75) Inventors: Xiaobin Wang, Chanhassen, MN (US); Kaizhong Gao, Eden Prairie, MN (US)

(73) Assignee: Seagate Technology LLC, Cupertino, CA (US)

(*) Notice: Subject to any disclaimer, the term of this patent is extended or adjusted under 35 U.S.C. 154(b) by 252 days.

This patent is subject to a terminal disclaimer.

(21) Appl. No.: 13/077,948

(22) Filed: Mar. 31, 2011

(65) Prior Publication Data

US 2012/0250404 A1    Oct. 4, 2012

(51) Int. Cl.
H01L 43/08 (2006.01)

(52) U.S. Cl.
USPC ........... 257/421; 365/171; 365/158; 365/148; 365/173; 365/100; 428/842.3; 428/827; 360/324.11; 427/131; 257/E29.323

(58) Field of Classification Search
USPC ............... 428/827, 834, 842.3; 365/171, 158, 365/148, 173, 100; 257/421, E29.323; 360/324.11
See application file for complete search history.

(56) References Cited

U.S. PATENT DOCUMENTS

| | | | |
|---|---|---|---|
| 6,754,020 B1 | 6/2004 | Hikosaka et al. | |
| 7,796,428 B2 | 9/2010 | Redon | |
| 7,846,563 B2 | 12/2010 | Berger et al. | |
| 7,862,912 B2 | 1/2011 | Hellwig et al. | |
| 7,869,309 B2 | 1/2011 | Mihalcea et al. | |
| 2004/0110033 A1* | 6/2004 | Kuwajima et al. | 428/694 R |
| 2004/0166371 A1 | 8/2004 | Berger et al. | |
| 2004/0196593 A1 | 10/2004 | Yasui et al. | |
| 2004/0240327 A1 | 12/2004 | Sendur et al. | |
| 2005/0202287 A1 | 9/2005 | Lu et al. | |
| 2006/0061916 A1* | 3/2006 | Li et al. | 360/324.11 |
| 2006/0269797 A1* | 11/2006 | Lu et al. | 428/834 |
| 2007/0026263 A1 | 2/2007 | Kubota et al. | |
| 2007/0159721 A1 | 7/2007 | Honda et al. | |
| 2007/0172705 A1 | 7/2007 | Weller et al. | |
| 2008/0026255 A1 | 1/2008 | Das et al. | |
| 2008/0151607 A1* | 6/2008 | Hosomi et al. | 365/158 |
| 2009/0040644 A1 | 2/2009 | Lu et al. | |
| 2009/0262457 A1 | 10/2009 | Rivkin et al. | |
| 2010/0055503 A1 | 3/2010 | Shimatsu et al. | |
| 2010/0110576 A1 | 5/2010 | Akagi et al. | |
| 2010/0110577 A1 | 5/2010 | Weller et al. | |
| 2010/0129685 A1 | 5/2010 | Gao et al. | |
| 2010/0177605 A1 | 7/2010 | Mallary | |

(Continued)

OTHER PUBLICATIONS

Gavrila et al. "Magnetic Materials for Advanced Magnetic Recording Media." Journal of Optoelectronics and Advanced Materials. vol. 5, No. 4. p. 919-932. Dec. 2003.

(Continued)

Primary Examiner — Jerome Jackson, Jr.
Assistant Examiner — Bo Fan
(74) Attorney, Agent, or Firm — Hollingsworth Davis, LLC

(57) ABSTRACT

A magnetic tunnel junction device includes a reference magnetic layer and a magnetic free layer including first and second magnetic elements that are magnetically exchange coupled. The magnetic exchange coupling between the first and second magnetic elements is configured to achieve a switching current distribution less than about 200% and a long term thermal stability criterion of greater than about 60 $k_B T$.

20 Claims, 21 Drawing Sheets

(56) References Cited

U.S. PATENT DOCUMENTS

| | | | |
|---|---|---|---|
| 2010/0182714 A1 | 7/2010 | Kanbe et al. | |
| 2010/0208386 A1 | 8/2010 | Lauhoff | |
| 2010/0209737 A1* | 8/2010 | Bian et al. | 428/827 |
| 2010/0302679 A1 | 12/2010 | Kamata et al. | |
| 2010/0309577 A1 | 12/2010 | Gao et al. | |
| 2011/0003175 A1 | 1/2011 | Valcu et al. | |
| 2011/0007558 A1 | 1/2011 | Mryasov et al. | |
| 2011/0020669 A1 | 1/2011 | Sayama et al. | |
| 2011/0044099 A1* | 2/2011 | Dieny | 365/171 |
| 2011/0048628 A1 | 3/2011 | Sato | |
| 2011/0069537 A1 | 3/2011 | Gao et al. | |
| 2011/0235205 A9 | 9/2011 | Lu et al. | |
| 2012/0212998 A1 | 8/2012 | Ranjan et al. | |

OTHER PUBLICATIONS

Kryder et al. "Heat Assisted Magnetic Recording." Proceedings of the IEEE. vol. 96, No. 11. p. 1810-1835. Nov. 2008.

Lou et al. "Demonstration of multilevel cell spin transfer switching in MgO magnetic tunnel junctions." Applied Physics Letters. vol. 93, 242502. 2008.

Matsumoto et al. "Thermally Assisted Magnetic Recording." Fujitsu Sci. Tech. J. vol. 42, No. 1. p. 158-167. Jan. 2006.

Microwave-Assisted Magnetic Recording for Next Gen HDD. Press Release edited by StorageNewsletter.com on Nov. 30, 2010.

Nolan et al. "Effect of Composite Designs on Writability and Thermal Stability of Perpendicular Recording Media." IEEE Transactions on Magnetics. vol. 47, No. 1. p. 63-68. Jan. 2011.

Prejbeanu et al. "Thermally assisted MRAM." J. Phys.: Condens. Matter. vol. 19, No. 16. p. 1-26. 2007.

Ross, CA. "Patterned Magnetic Recording Media." Annu. Rev. Mater. Res. vol. 31. p. 203-235. 2001.

Stoll, C. "Numerical Simulations on Microwave Assisted Magnetic Recording (MAMR)." Undergraduate Research Presentations. Apr. 8, 2009.

Wang et al. "Spintronic Memristor Through Spin-Torque-Induced Magnetization Motion." IEEE Electron Device Letters. vol. 30, No. 3. p. 294-297. Mar. 2009.

Wang et al. "Spin Torque Induced Magnetization Switching Variations." IEEE Transactions on Magnetics. vol. 45, No. 4. p. 2038-2041. Apr. 2009.

Wang et al. "Magnetization Switching in Spin Torque Random Access Memory: Challenges and Opportunities." CMOS Processors and Memories, Springer. 2010.

Wu et al. "Studies of switching field and thermal energy barrier distributions in a FePt nanoparticle system." Journal of Applied Physics. vol. 93, No. 10. p. 7181-7183. May 2003.

File History for U.S. Appl. No. 13/077,946.

* cited by examiner

MAGNETIC TUNNEL JUNCTION WITH FREE LAYER HAVING EXCHANGE COUPLED MAGNETIC ELEMENTS

SUMMARY

A magnetic tunnel junction device includes a magnetic reference layer and a magnetic free layer. The free layer includes first and second magnetic elements that are magnetically exchange coupled. The magnetic exchange coupling between the first and second magnetic elements is configured to achieve a switching current distribution less than about 200% and a long term thermal stability criterion of greater than about 60 $k_B T$.

DETAILED DESCRIPTION

The demand for increased areal densities in magnetic storage devices drives smaller and smaller memory elements. Dynamic thermal magnetization switching and magnetization switching variability are factors involved in scaling magnetic memory elements. These factors apply to both magnetic media for hard disk drive (HDD) applications and for magnetoresistive random access memory (MRAM) such as current switched spin torque random access memory (SPRAM) and magnetically switched MRAM (designated herein as MMRAM).

Figure 1A:
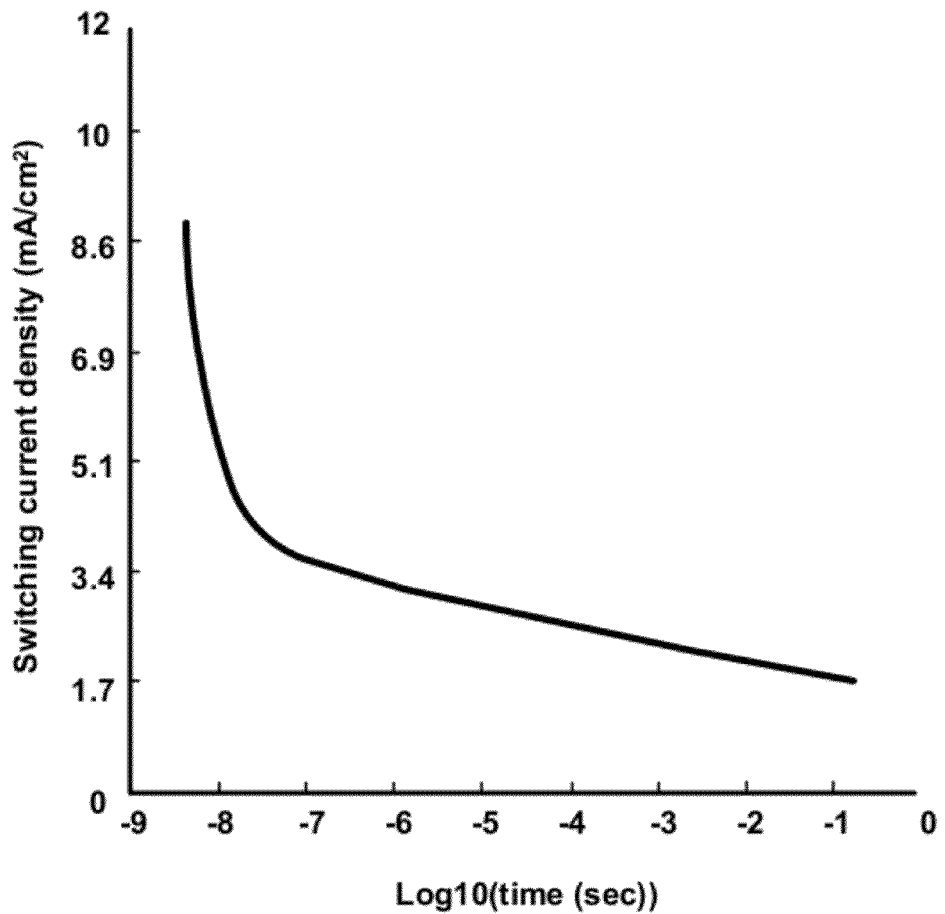
FIG. 1A is a graph that shows switching current density as a function of time for magnetic elements in accordance with some embodiments.
Figure 1B:
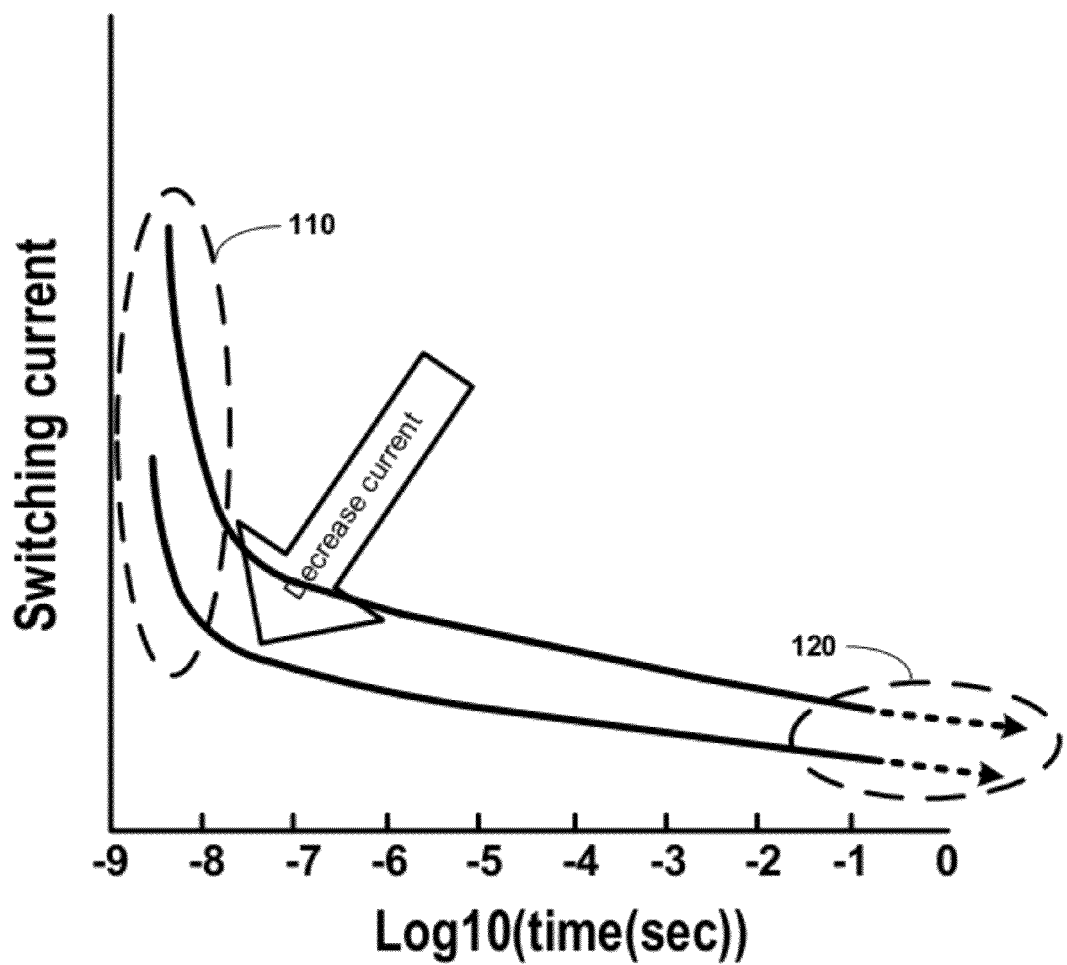
FIG. 1B is a graph that shows reduction of switching current as a function of time for magnetic elements in accordance with some embodiments.

The operation of SPRAM is based on macroscopic magnetization switching through current-induced microscopic spin transfer that occurs on a nanosecond time scale. SPRAM memory cells can maintain stable macroscopic magnetization at storage temperatures at a time scale that can extends to years. In SPRAM, the writability vs. thermal stability constraint can be understood when considering switching current density vs. switching time as illustrated in FIG. 1A. There is a rapid increase in the switching current density as time scales down from seconds to nanoseconds. Decreasing the size of SPRAM memory cells while maintaining, decreasing or not significantly increasing the current density can be accomplished by decreasing the switching current, as conceptually illustrated in FIG. 1B. Decreasing the device size and switching current can mitigate the increase in switching current in the nanosecond time frame 110, but may concurrently diminish the long term thermal stability of the device which is extends beyond the second to nanosecond time frame and may be measured in years.

As discussed in more detail herein, the switching current distribution is another factor in the scalability of SPRAM. Increased variability due to device dimension reduction, random thermal fluctuations, and/or other factors can degrade switching current distribution (SCD) and device performance. Approaches discussed in the present disclosure involve approaches to reduce the switching current and/or switching current distribution (SCD) of SPRAM devices through the use of exchange coupled magnetic elements. The switching current reduction and/or SCD reduction may be accomplished while maintaining a predetermined long term thermal stability criterion.

Figure 2:
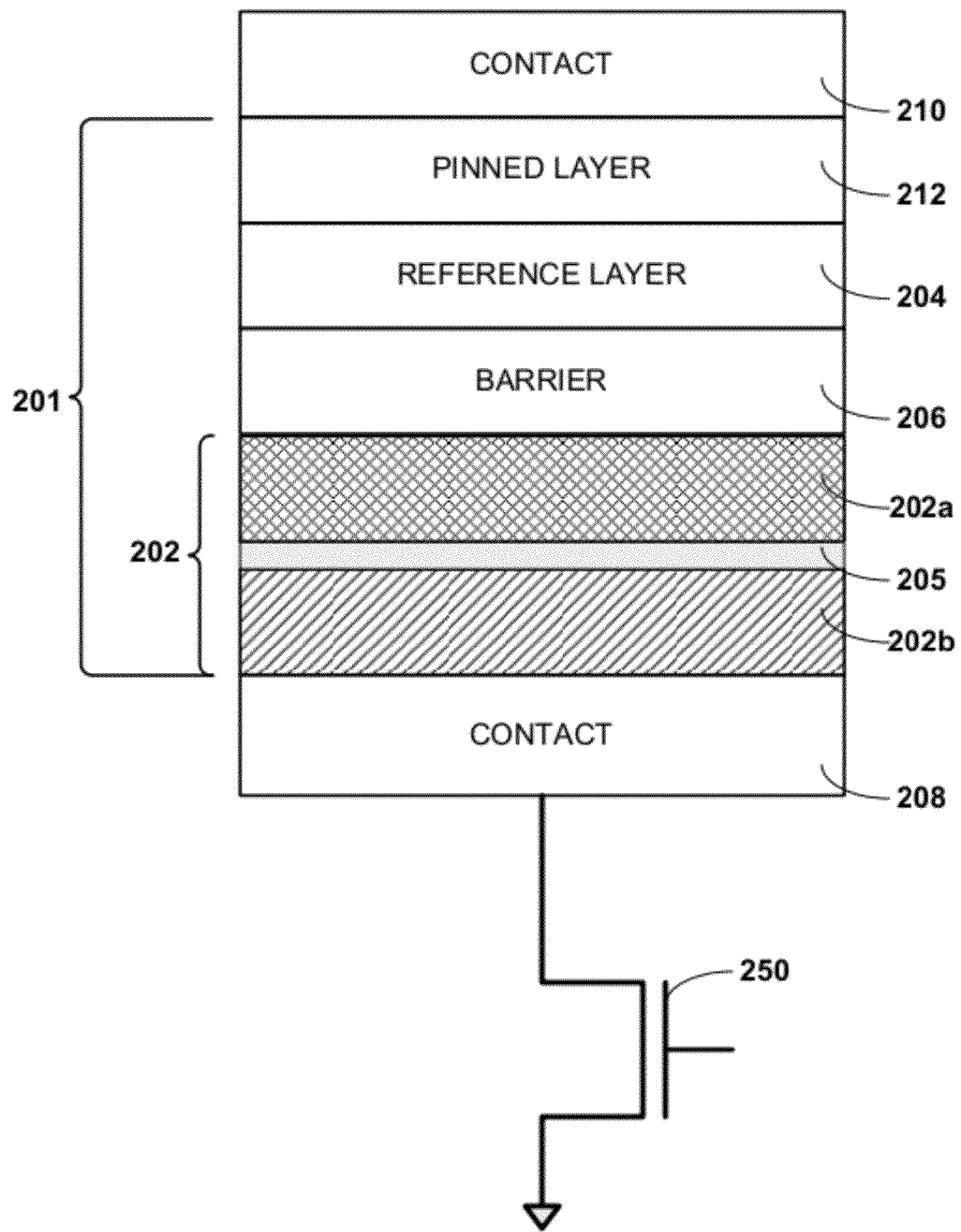
FIG. 2 shows a spin torque random access memory cell having a free layer with exchange coupled elements in accordance with some embodiments.

An SPRAM device structure is illustrated in FIG. 2. The SPRAM includes a magnetic tunneling junction (MTJ) 201 comprising a fixed reference magnetic layer 204 which has a magnetization direction that is pinned by a pinning layer 212 and a free magnetic layer 202 separated from the reference layer 204 by a barrier layer 206. The MTJ is arranged between contact layers 208, 210 and is accessed through a select transistor, 250. In the illustrated example, the free magnetic layer 202 includes two exchange coupled magnetic elements, 202a, 202b. An exchange coupling layer 205 is disposed between the magnetic elements 202a, 202b.

The resistance of the MTJ 201 depends on the relative magnetization directions of the reference and free magnetic layers 204, 202. The magnetization direction of the free layer 202 of the MTJ 201 can correspond to stored binary data. When the magnetization directions of the reference and free layers 204, 202 are parallel, the MTJ 201 is in a low resistance state. When the magnetization directions of the reference and free layers 204, 202 are antiparallel, the MTJ 201 is in a high resistance state.

To read the data stored in the MTJ 201, the select transistor 250 is turned on and a read current is passed through the MTJ 210. The magnetization information, i.e., the parallel or antiparallel magnetization state of the MTJ reference and pinned layers 204, 202, is transformed into electrical information as a sensed low or high resistance state.

Data can be written to the MTJ 201 using spin torque induced magnetization switching. The writing operation of the MTJ 201 is based on spin polarization of an injected electron current to achieve magnetization switching of the free magnetic layer 202. To switch the free layer magnetization to the same direction as the reference layer magnetization, a write current is passed through the MTJ 201 in which electrons flow from the reference layer 204 to the free layer 202. The electrons of the injected write current have spins aligned in the same and opposite directions as the reference layer magnetization. The reference layer 204 acts as a polarizing filter for the electrons of the injected current. Electrons passing through the reference layer 204 have a preferred spin orientation pointing in the same direction as the reference layer magnetization. The preferred spin orientation arises because most of the electrons with spins opposite to the magnetization direction of the reference layer 204 are reflected due to interaction between the electron spins of the injected current and the reference layer local magnetization. The polarized current electrons with a net spin moment aligned with the reference layer magnetization to switch the free layer magnetization to the same direction as the reference layer magnetization.

To switch the free layer magnetization to the direction opposite the magnetization direction of the reference layer 204, an write current is passed through the MTJ 201 in which electrons flow from the free layer 202 to the reference layer 204. Electrons having spins aligned with magnetization direction of the reference layer 204 pass through the reference layer 204. Electrons with spins opposite to the magnetization direction of the reference layer 204 are reflected back toward the free layer 202. These reflected electrons act to switch the magnetization direction of the free layer 202 to the direction opposite to that of the reference layer magnetization.

Figure 3:
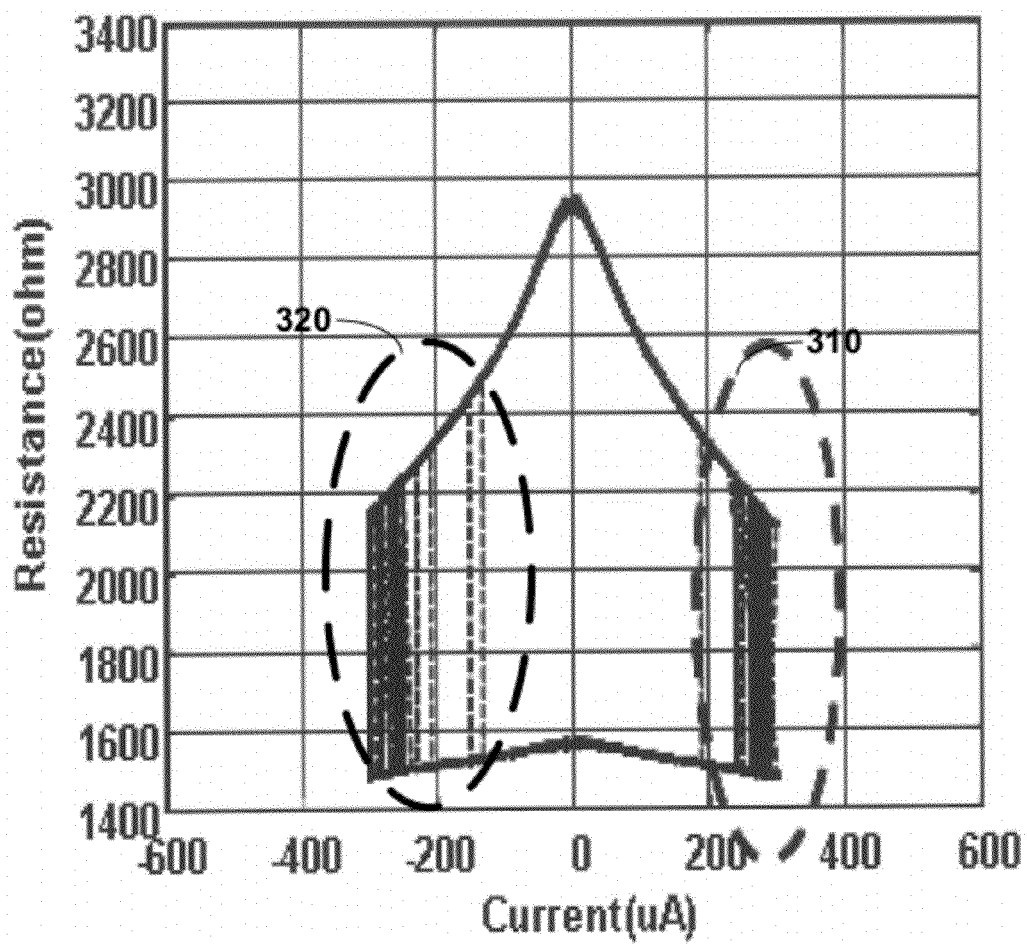
FIG. 3 illustrates switching current variability for an MRAM device.
Figure 4:
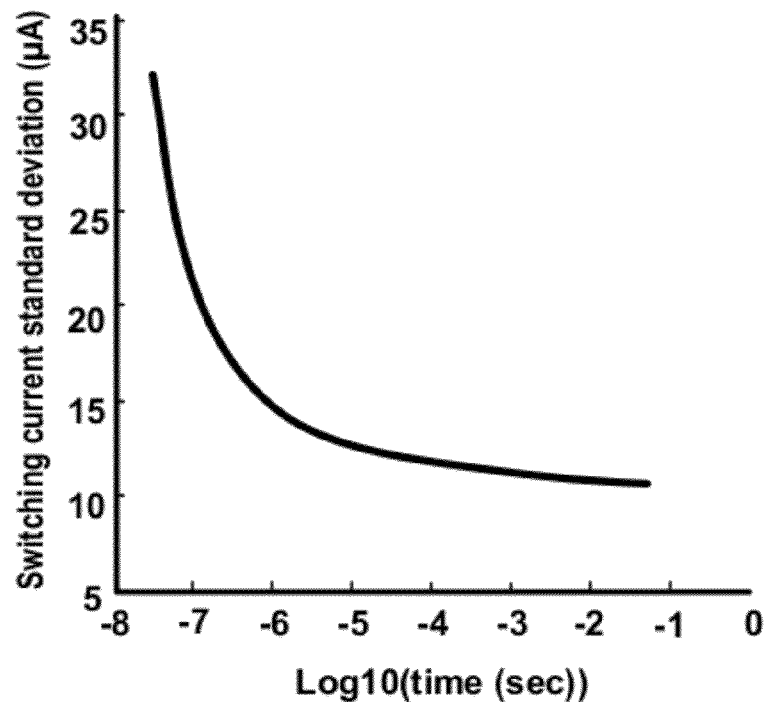
FIG. 4 is a graph that shows switching current standard deviation with respect to time.

There are several sources that give rise to variability in the switching current to switch the magnetization direction of the free layer. For example, variability in memory cell processing can cause variation in SPRAM switching current. As another example, variability in SPRAM switching current may arise from random thermal fluctuations. FIG. 3 illustrates the measured resistance versus current for a SPRAM memory cell that does not include the magnetically exchange coupled magnetic elements illustrated in FIG. 2. The graphs shown in FIG. 3 correspond to switching a memory cell multiple times and illustrate the variation in switching current to switch the MTJ from the high resistance state (e.g., corresponding to a logical "1") to the low resistance state (e.g., corresponding to a logical "0"). In FIG. 3, the upper graph corresponds to a high resistance state and the lower graph corresponds to a low resistance state. Transitions from the high resistance state to the low resistance state are indicated by the dashed lines enclosed by ellipse 310. Transitions from the low resistance state to the high resistance state are indicated by the dashed lines enclosed by ellipse 320. As can be appreciated by studying FIG. 3, there is variation in the switching current that achieves transitions from one state to another. The variation in switching current that is to achieve a transition from one state to another state is referred to herein as the switching current distribution (SCD). The SCD illustrated in FIG. 3 is due to thermal fluctuations at room temperature. FIG. 4 shows the standard deviation of the switching current as a function of time. As can be appreciated from FIG. 4, the switching current standard deviation increases rapidly at the second to nanosecond time scale.

Figure 5:
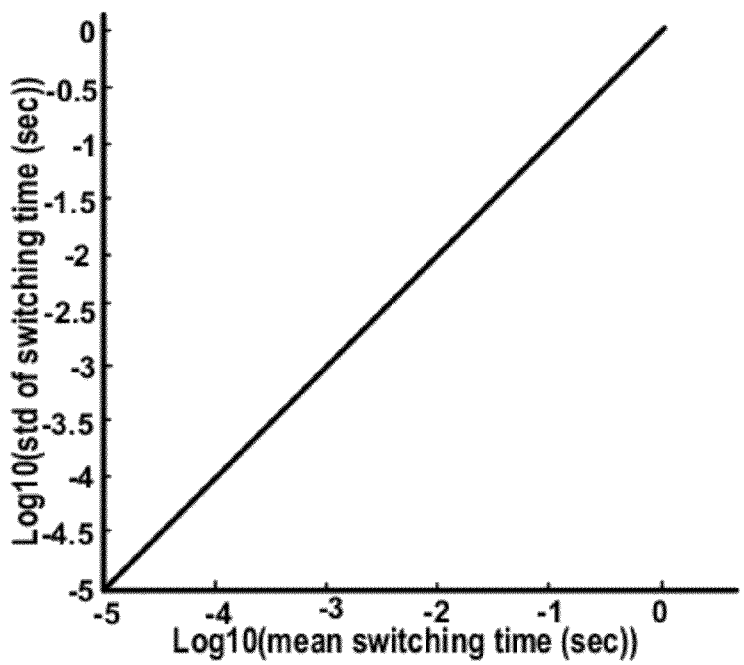
FIG. 5 is a graph of standard deviation of switching time with respect to mean switching time.

FIG. 5 shows an example of measured and modeled switching time distribution which is the switching time standard deviation divided by the mean switching time. Comparison of FIGS. 4 and 5 show that switching current variation and switching time variation scale differently in about the 0.1 sec to 10 nsec time scale. As time scales down, the switching time distribution decreases whereas the switching current distribution increases. Due to the rapid increase in switching current density vs. switching time, a small switching time variation due to thermal fluctuations in the nanosecond time frame implies a large switching current distribution.

As magnetic device size scales down, achieving fast nanosecond time scale magnetization switching and maintaining thermal stability at second to years time scale becomes a challenge. Embodiments described in this disclosure involve approaches to reduce the switching current and switching current distribution while maintaining a predetermined long term thermal stability through the use of a free layer that comprises a set of two ore more coupled magnetic elements. The magnetically coupled set can be configured to reduce the switching current and SCD of the SPRAM at nanosecond time scales. The magnetically coupled set can additionally or alternatively be configured to achieve a predetermined long term thermal stability of the SPRAM device at a time scale of years.

The magnetic coupled set includes at least two magnetic elements comprising materials of possibly different anisotropies, $H_{k1}$, $H_{k2}$, possibly different saturation magnetizations, $M_{s1}$, $M_{s2}$, possibly different volumes, $V_1$, $V_2$ and/or possibly different Curie temperatures. The two magnetic elements may have the same aspect ratio or different aspect ratios and/or may have the same thickness and/or different thicknesses. The coupled magnetic elements may be separated by an exchange coupling layer which is configured to tune the exchange coupling between the elements to achieve a predetermined SCD and/or a predetermined thermal stability criterion.

Figure 6A:
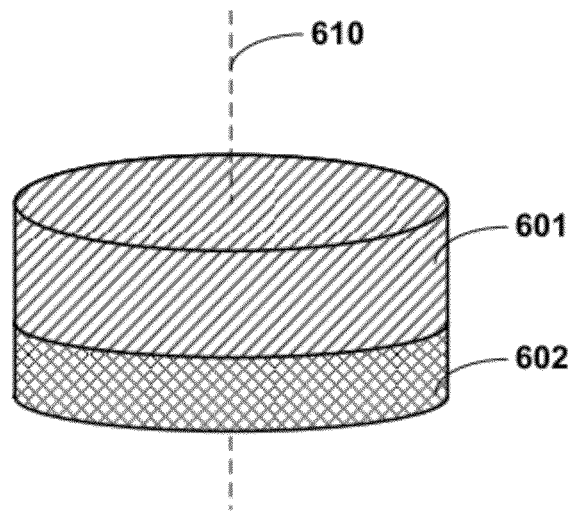
FIG. 6A illustrates exchange coupled magnetic elements having about the same geometric aspect ratio, but not necessarily the same thickness, aligned vertically along an axis.
Figure 6B:
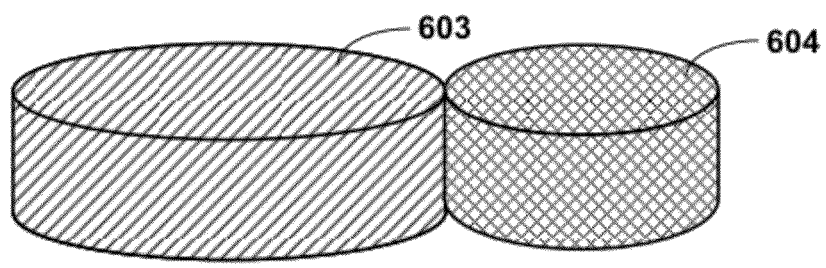
FIG. 6B illustrates exchange coupled magnetic elements aligned horizontally in a plane.

FIG. 6A illustrates exchange coupled magnetic elements 601, 602 having about the same geometric aspect ratio, but not necessarily the same thickness, aligned vertically along axis 610. In some cases, the magnetic elements may be aligned horizontally in a plane, as illustrated in FIG. 6B. The illustrated magnetic elements 603, 604 of FIG. 6B have different aspect ratios and the same thickness.

Figure 6C:
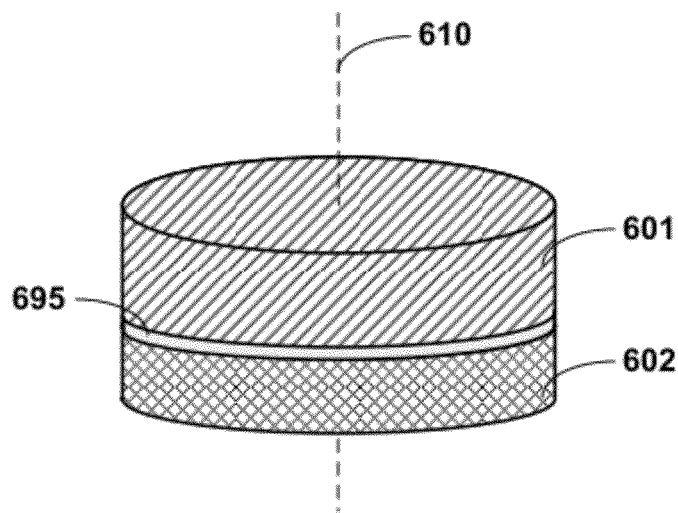
FIGS. 6C and 6D show and exchange coupling layer disposed between magnetic elements.
Figure 6D:
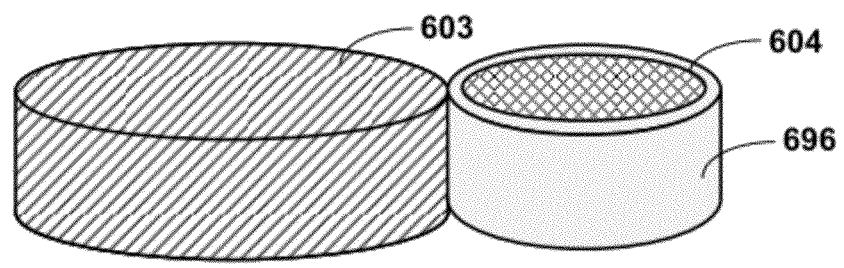

As shown in FIGS. 6C and 6D, the coupled magnetic elements 601, 602 (FIG. 6C), 603, 604 (FIG. 6D) may be separated by exchange coupling layer 695, 696. The exchange coupling between the coupled magnetic elements 601, 602, 603, 604 may be increased or decreased by adjusting the composition, thickness, and/or deposition parameters of the exchange coupling layer 695, 696.

Figure 6E:
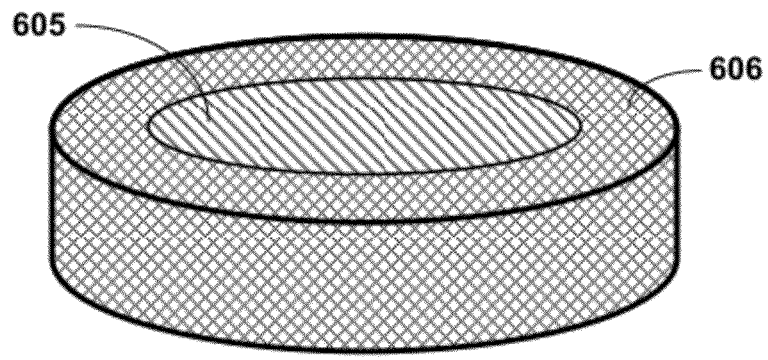
FIG. 6E illustrates a configuration of exchange coupled magnetic elements wherein the material of a first magnetic element surrounds a second magnetic element.
Figure 6F:
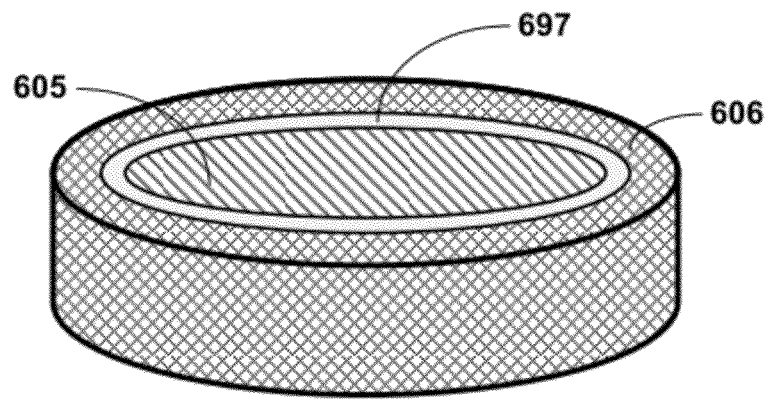
FIG. 6F illustrates a configuration of exchange coupled magnetic elements wherein the material of a first magnetic element surrounds a second magnetic element which are separated by an exchange coupling material.

FIG. 6E illustrates yet other configurations in which the material of a first magnetic element 605 surrounds a second magnetic element 606. The first magnetic element 605 may fully or partially surround the second magnetic element 606. FIG. 6F is similar to FIG. 6E except that FIG. 6E includes an exchange coupling layer 697 disposed between the first magnetic element 605 and the second magnetic element 606.

As previously discussed, the first and second magnetic elements may have differing anisotropies, saturation magnetizations, volumes and/or other properties. Notice here for MRAM application, the anisotropy could refer to all the sources of anisotropy, including crystal anisotropy and shape anisotropy The anisotropy constant, $K_{1,2}$ for first and second exchange coupled magnetic elements having differing anisotropies, $H_{k1}$, $H_{k2}$ and/or saturation magnetizations, $M_{s1}$, $M_{s2}$, may be parameterized as an anisotropy ratio:

$$K_{1,2} = M_{s2}H_{k2}/M_{s1}H_{k1} \qquad [1]$$

In some implementations, the first magnetic element may be a magnetically hard material having a relatively higher anisotropy than the anisotropy of the second magnetic element, which may be a relatively magnetically soft material, i.e., $H_{k1} > H_{k2}$. The exchange coupling interaction parameter, $h_{ex}$, between the first and second magnetic elements may be parameterized as:

$$h_{ex} = J^{M_{s2}/H_{k1}}, \qquad [2]$$

where J represents the exchange coupling strength between magnetic elements.

The exchange coupling interaction parameter, $h_{ex}$, represents the effect of the magnetization of the second magnetic element on the first magnetic element given the exchange coupling strength, J. If an exchange coupling layer is used, the exchange coupling interaction parameter, $h_{ex}$, is dependent on the composition, thickness, and/or deposition parameters of the exchange coupling layer. Two exchanged coupled magnetic elements having anisotropy ratio of $K_{1,2}=1$ and exchange coupling parameter $h_{ex}=0.8$ provides good correspondence to a single element with coherent magnetization.

For a coupled structure, the volumes of the individual magnetic elements, the anisotropies of the individual magnetic elements, and the saturation magnetizations of the individual magnetic elements and/or the exchange coupling between the magnetic elements may be selected to achieve both a predetermined thermal stability criterion corresponding to about 60 to about 90 $k_BT$ at a storage temperature (e.g., about 300K). Additionally or alternatively, the volumes of the individual magnetic elements, the anisotropies of the individual magnetic elements, and the saturation magnetizations of the individual magnetic elements and/or the exchange coupling between the magnetic elements may be selected to achieve a predetermined switching current and/or switching current distribution (SCD). The SCD, calculated as the standard deviation $\sigma_{SC}$ of the switching current probability density function divided by the mean switching current, may be a range from about 0.02 to less than 1. For example, in certain applications, the SCD may be about 2%, about 5%, about 10% or about 20%, or about 50% or other value. The SCD may be less than about 200% in some cases. In some applications, the long term thermal stability of the SPRAM may be equal to or greater than 60 $k_BT$ or in a range of about 60 $k_BT$ to about 90 $k_BT$.

For example, in SPRAM applications, the anisotropy of the first and second magnetic elements may be less than about 200,000 k Oe or less than about 100,000 k Oe. In some implementations, one of the magnetic elements is magnetically harder than another of the magnetic elements. In these implementations, the harder magnetic element may have anisotropy of about 10,000K Oe to about 200,000K Oe. The softer magnetic element may have an anisotropy less than the anisotropy of the harder magnetic element. The magnetic elements can have magnetization saturation in a range of about 300 emu/cc to about 2000 emu/cc, the diameter of the magnetic elements may be between about 4 nm and about 200 nm, a thickness of the magnetic elements may be between about 0.2 nm and about 100 nm and the volume of the magnetic elements maybe between about 2 $nm^3$ and about 10,000 $nm^3$. The exchange coupling interaction parameter, $h_{ex}$, may be between about 0.001 and about 10.

According to some aspects, the properties of the coupled magnetic elements and/or the exchange coupling layer of the free layer of an SPRAM may be selected to achieve the criteria of predetermined switching current, SCD, and/or long term thermal stability. As can be appreciated by contemplating FIGS. 8C and 9C and the discussion below, the SCD for the coupled magnetic elements of the SPRAM free layer is dependent on the anisotropy parameter, $K_{1,2}$, of the coupled magnetic elements. As one example, for coupled magnetic elements having $M_{s1}=M_{s2}$, the anisotropy of one of the magnetic elements, e.g., $H_{k2}$ of the first magnetic element, can be adjusted to achieve a reduction in the SCD to meet a predetermined SCD criterion. However, a decrease in $H_{k2}$ decreases the long term thermal stability of the coupled system at the storage temperature. To maintain the predetermined long term thermal stability criterion, the volume of either element and/or the anisotropy, $H_{k1}$, of the first magnetic element can to be increased.

Figure 7:
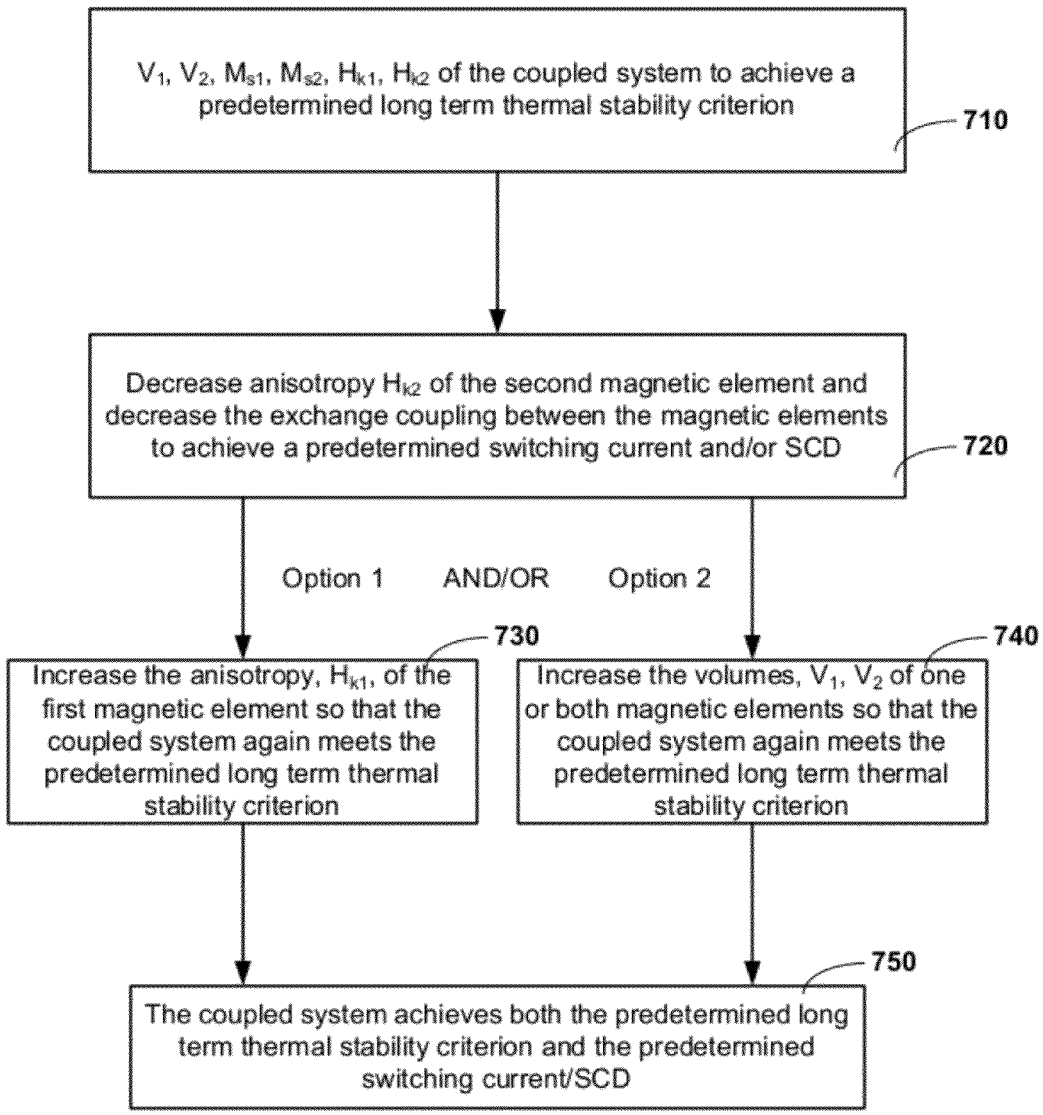
FIG. 7 is a flow diagram showing a process for tuning parameter values of the coupled magnetic elements to achieve both a predetermined write temperature SFD criterion and a predetermined storage temperature thermal stability criterion.

The flow diagram of FIG. 7 illustrates a process for selecting parameter values of the coupled magnetic elements to achieve switching current and/or SCD reduction and/or long term thermal stability criterion. The first and second magnetic elements can initially be considered to have 710 volumes, $V_1$, $V_2$, saturation magnetizations, $M_{s1}$, $M_{s2}$, and anisotropies $H_{k1}$, $H_{k2}$ that achieve a predetermined long term thermal stability criterion, e.g., about 60 to 90 $k_BT$. For example, the parameters used to achieve the long term thermal stability criterion may correspond to the case of an individual coherent magnetic element. For the coupled system, this corresponds to $K_{1,2}=1$ and $h_{ex}=0.8$. The anisotropy, $H_{k2}$, of the second magnetic element is decreased and the exchange coupling between the first and second magnetic elements is decreased 720 to achieve a predetermined switching current and/or SCD criterion. Note that decreasing the exchange coupling is reflected in a decrease in $h_{ex}$. Decreasing $H_{k2}$ and decreasing the exchange coupling causes the coupled system to no longer meet the long term thermal stability criterion.

As illustrated in FIG. 7, the long term thermal stability criterion can be restored using Option 1, Option 2, or a combination of both Option 1 and Option 2. Option 1 involves increasing 730 the anisotropy, $H_{k1}$, of the first magnetic element, while maintaining the other parameters mentioned above at their previous values, until the coupled system again meets the long term thermal stability criterion. Option 2 involves increasing 740 the volume, $V_1$, of the first magnetic element, the volume, $V_2$, of the second magnetic element, or both, while maintaining the other parameters mentioned above at their previous values, until the coupled system again meets the storage temperature thermal stability criterion. A combination of Option 1 and Option 2 may also be used wherein both the volumes of either or both elements and the anisotropy of the first magnetic element is increased until the storage temperature thermal stability criterion it met. Using Option 1 and/or Option 2 allows the coupled system to achieve both the predetermined storage temperature thermal stability criterion and the predetermined switching current and/or SCD.

Figure 8A:
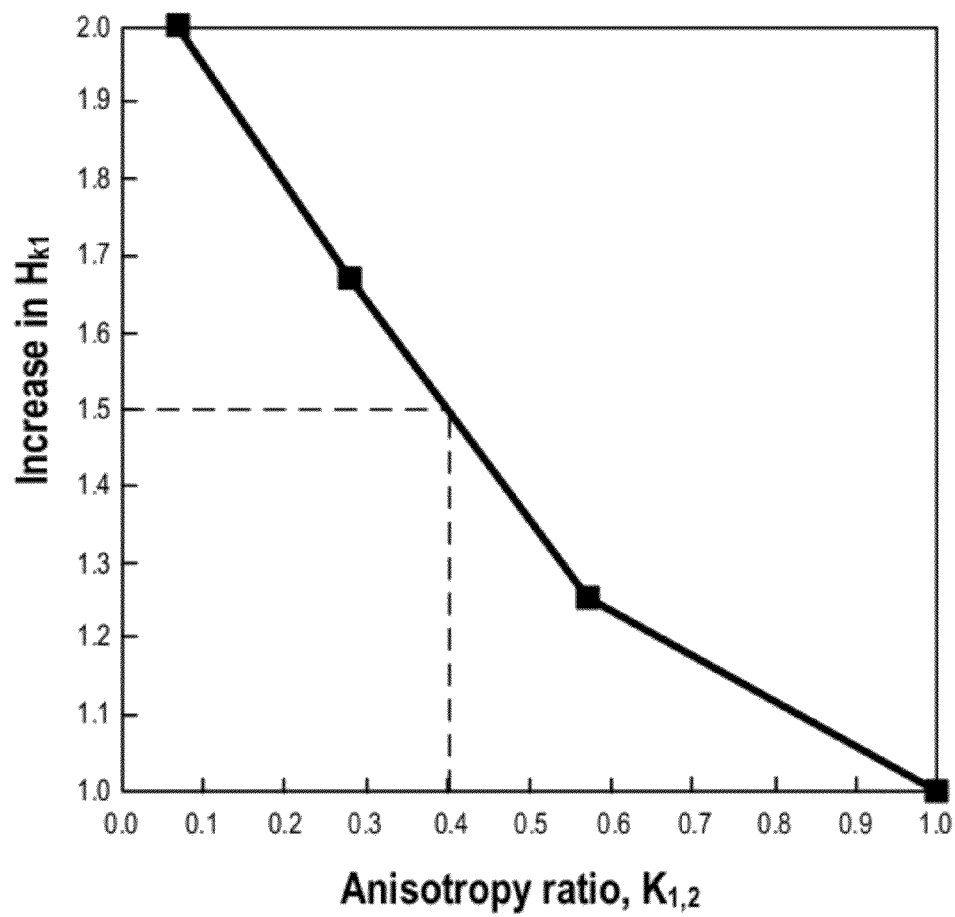
FIG. 8A is a graph that shows how much the anisotropy of the magnetic element $H_{k1}$ is increased to maintain the predetermined thermal stability when anisotropy ratio of an exchange coupled magnetic element, $K_{1,2}$ is decreased to achieve the predetermined switching current distribution (SCD)
Figure 8B:
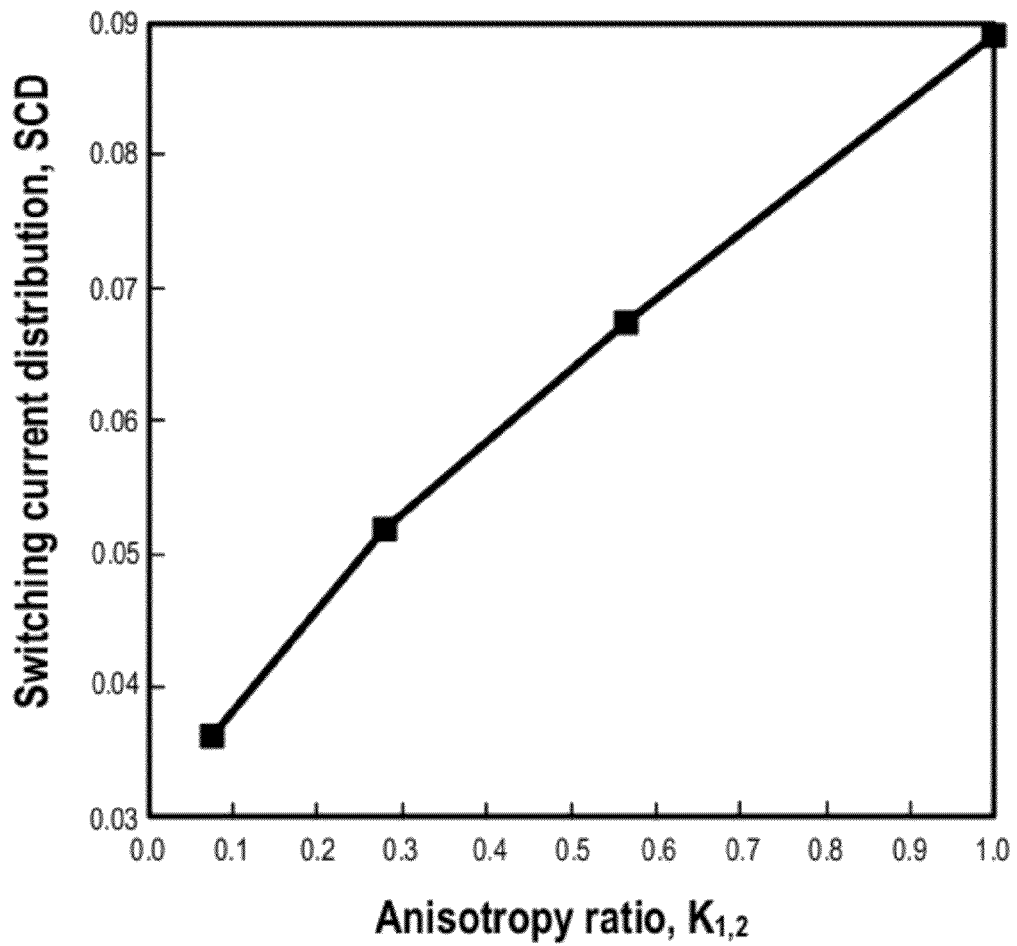
FIG. 8B is a graph illustrating the decrease in the SCD of the coupled magnetic elements as a function of the anisotropy ratio, $K_{1,2}$.
Figure 8C:
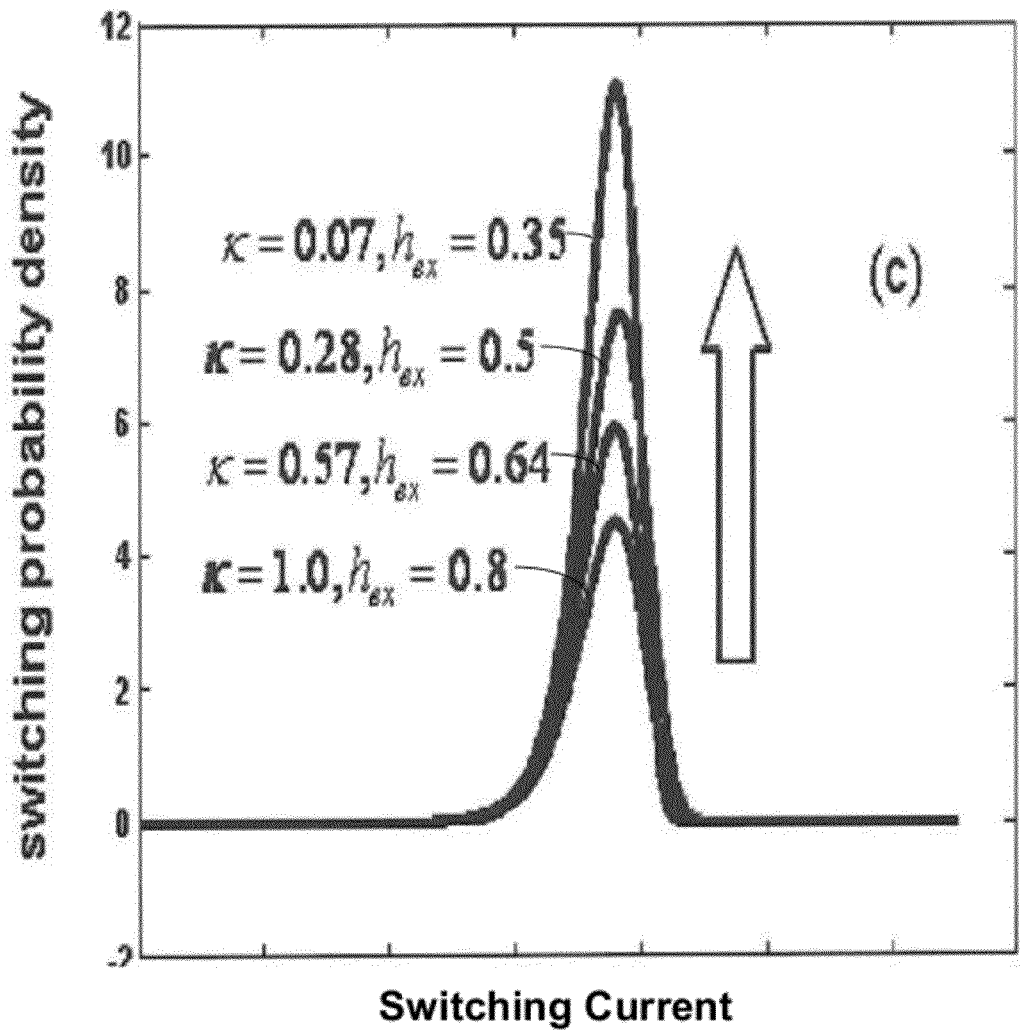
FIG. 8C graphically illustrates changes in the switching current probability density function as $H_{k1}$ is increased.

FIGS. 8A-8B illustrate reduction of the SCD can be achieved through Option 1 discussed previously in connection with FIG. 7. In this example, the magnetic element volumes, $V_1$ and $V_2$, of the first and second magnetic elements are maintained unchanged from their initial values. The anisotropy, $H_{k2}$, of the second magnetic element is decreased and the exchange coupling between the magnetic elements is decreased to achieve a predetermined SCD. The decrease in $H_{k2}$ causes the anisotropy ratio $K_{1,2}$ to decrease. The anisotropy, $H_{k1}$, of the first magnetic element is increased to compensate for the reduction in $H_{k2}$ (which causes a decrease in $K_{1,2}$) so that the predetermined storage temperature thermal stability criterion is maintained. The graph of FIG. 8A shows how much the anisotropy, $H_{k1}$, of the magnetic element is increased to maintain the predetermined storage temperature thermal stability criterion when the anisotropy ratio of an exchange coupled magnetic element, $K_{1,2}$ is decreased to achieve the predetermined SCD. As one example, if the decrease in $H_{k2}$ causes the anisotropy ratio, $K_{1,2}$ to decrease to 0.4, then $H_{k1}$ is increased to 1.5 times the initial $H_{k1}$. FIG. 8B shows the decrease in the SCD of the coupled system as a function of the anisotropy ratio, $K_{1,2}$. Increasing $H_{k1}$ causes a corresponding decrease in $K_{1,2}$, $h_{ex}$, and SCD. FIG. 8C shows the FIG. 4C graphically illustrates changes in the switching field probability density function as $H_{k1}$ is increased. Increasing $H_{k1}$ causes a corresponding decrease in $K_{1,2}$, $h_{ex}$, and SFD. The switching current probability density functions of FIG. 8C generally correspond to normal distributions. The SCD is the standard deviation of the switching current probability density function divided by the mean switching current. The first graph in FIG. 4C corresponds to $K_{1,2}=1.0$ and $h_{ex}=0.8$; the second graph corresponds to $K_{1,2}=0.57$ and $h_{ex}=0.64$; the third graph corresponds to $K_{1,2}=0.28$ and $h_{ex}=0.5$; and the fourth graph corresponds to $K_{1,2}=0.07$ and $h_{ex}=0.35$.

Figure 9A:
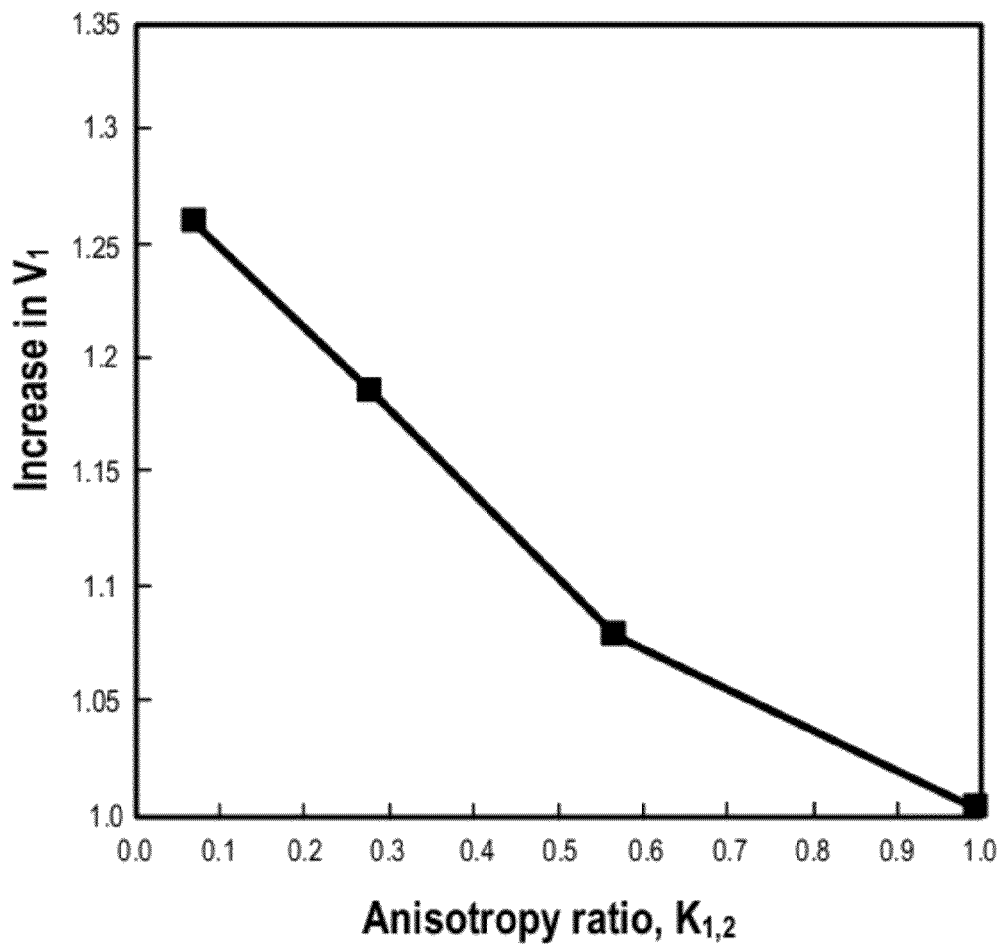
FIG. 9A is a graph that shows how much the volume $V_1$, of a first magnetic element is increased to maintain the predetermined thermal stability, when the anisotropy ratio, $K_{1,2}$ of coupled magnetic elements is decreased to achieve the predetermined SCD.
Figure 9B:
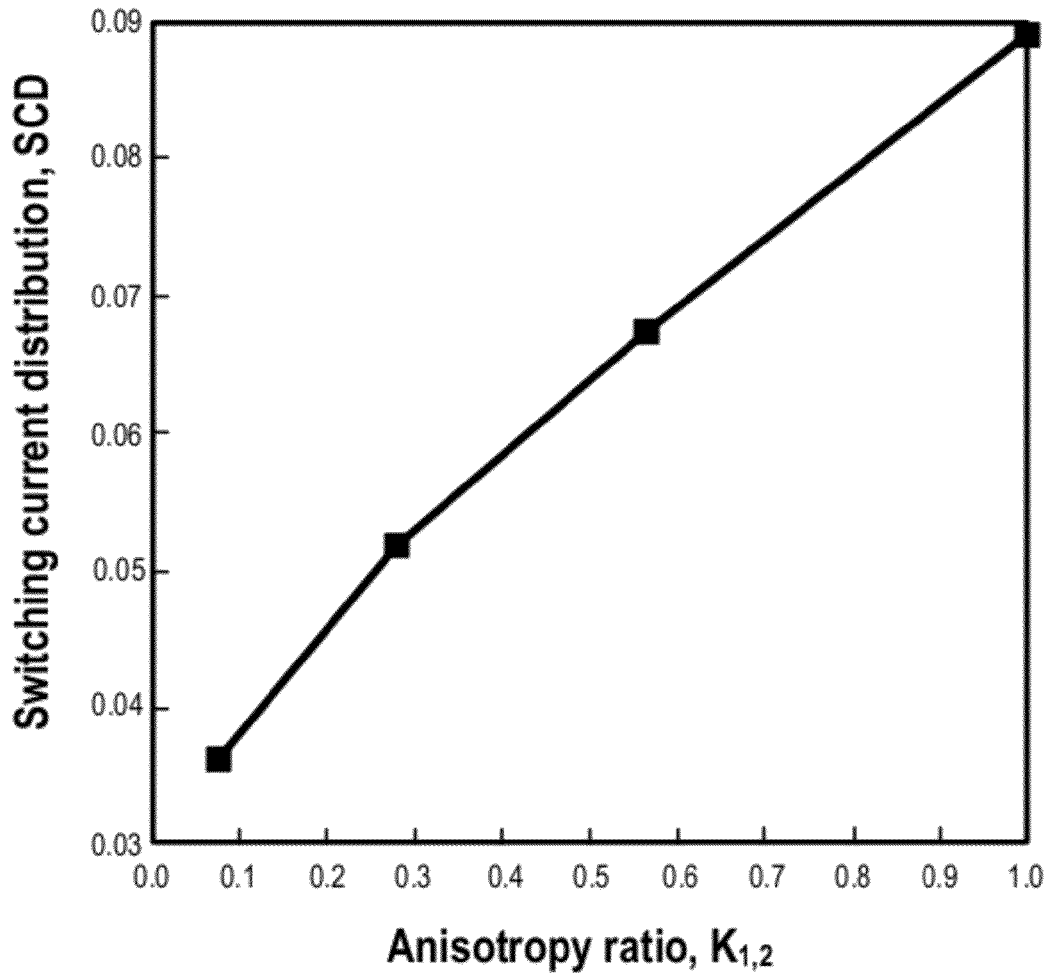
FIG. 9B graphically shows the decrease in the write temperature SCD of the coupled magnetic elements as a function of the anisotropy ratio, $K_{1,2}$.
Figure 9C:
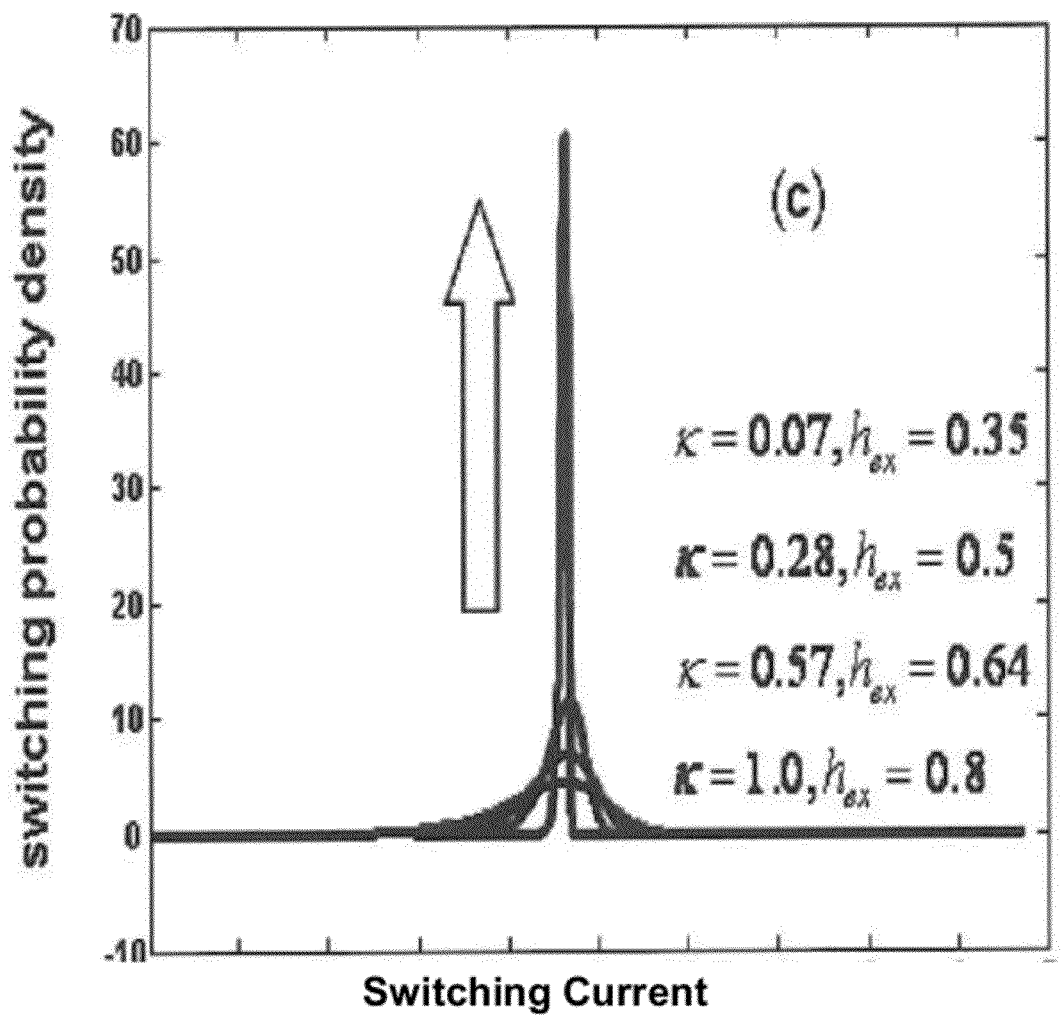
FIG. 9C graphically illustrates changes in the switching current probability density function as $V_1$ is increased.
Figure 10:
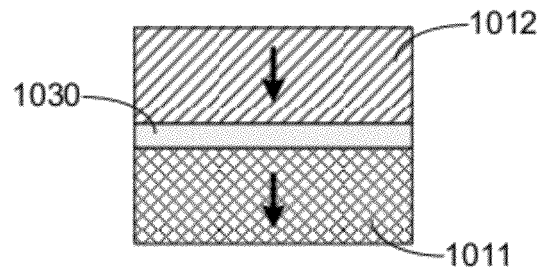
FIGS. 10-16 depict various configurations for sets of exchange coupled magnetic elements.

FIGS. 9A-9C illustrate how a reduction of the SCD can be achieved through Option 2 discussed previously in connection with FIG. 7. In this example, the anisotropies, $H_{k1}$ and $H_{k2}$, of the first and second magnetic elements are maintained unchanged from their initial values. In this example, the volume, $V_1$, of the first magnetic element is increased to compensate for the reduction in $H_{k2}$ and the corresponding decrease in $K_{1,2}$, so that the predetermined long term thermal stability criterion is maintained. FIG. 9A is a graph that shows how much the volume $V_1$, of a first magnetic element is increased to maintain the predetermined storage temperature thermal stability, when the anisotropy ratio, $K_{1,2}$ of coupled magnetic elements is decreased to achieve the predetermined SCD. FIG. 9B shows the SCD of the coupled system as a function of the anisotropy ratio, $K_{1,2}$. FIG. 9C graphically illustrates changes in the switching current probability density function as $V_1$ is increased. As illustrated in FIG. 5C, increasing $V_1$ causes a corresponding decrease in $K_{1,2}$, $h_{ex}$, and SCD.

FIGS. 10-16 are diagrams that illustrate sets of coupled magnetic storage elements 1011, 1012, 1111, 1112, 1211, 1212, 1311, 1312, 1411, 1412, 1511, 1512, 1611, 1612, 1613 that may be arranged to achieve the dual specifications of a predetermined thermal stability at the storage temperature of the device and a predetermined SCD. Note that. In FIGS. 10-17, the longer dimension of the paper is designated the vertical axis and the shorter dimension is designated the horizontal axis. These designations are arbitrarily chosen for convenience and the terms "vertical" and "horizontal" used in this context should not be considered limiting with regard to the orientation of magnetic elements and/or devices.

Figure 12:
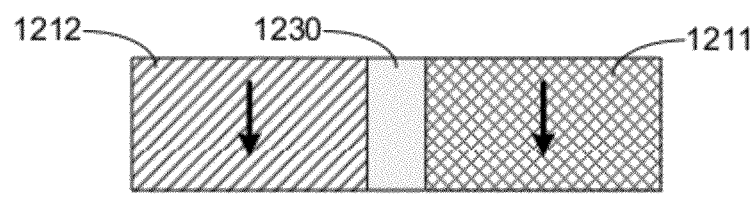
Figure 13:
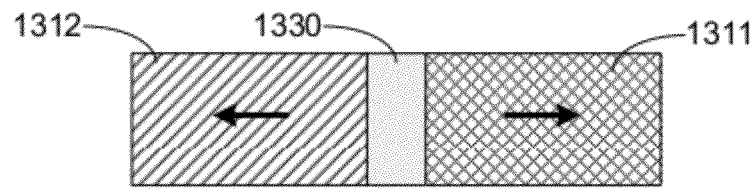
Figure 14:
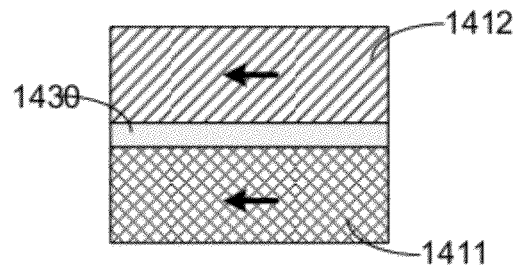
Figure 15:
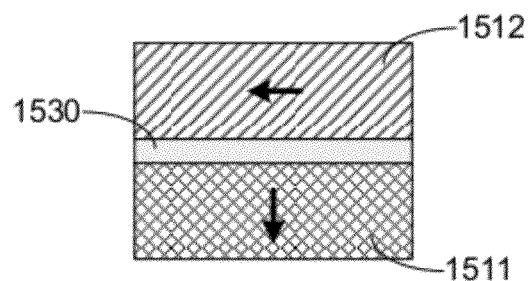
Figure 16:
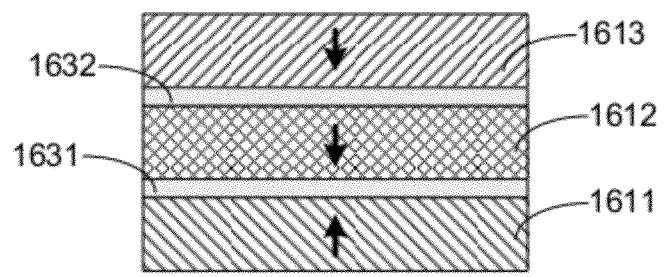

FIGS. 10, 11, and 14-16 show in cross section sets of vertically coupled magnetic element sets. FIGS. 12 and 13 show layers of horizontally coupled magnetic element sets. The elements of a coupled magnetic element sets are separated from one another by an exchange coupling material 1030, 1130, 1230, 1330, 1430, 1530, 1631, 1632 disposed between the coupled magnetic elements 1011, 1012, 1111, 1112, 1211, 1212, 1311, 1312, 1411, 1412, 1511, 1512, 1611, 1612, 1613. As previously discussed, the exchange coupling layer 1030, 1130, 1230, 1330, 1430, 1530, 1631, 1632 can be used to tune the exchange coupling to achieve the predetermined long term thermal stability, switching current and SCD. Note that the term "sets" may encompass two or more magnetic elements. For example, FIG. 16 illustrates coupled sets that include three vertically coupled magnetic elements 1611, 1612, 1613.

The length, width, diameter, and/or thickness of first magnetic elements of the sets can be the same as or different from the length, width, diameter, and/or thickness of the second and/or third magnetic elements in a coupled set. In some cases, the first magnetic have the same aspect ratio, i.e., length, width or diameter along the horizontal axis, as the second magnetic elements. The thickness of the first magnetic elements along the vertical axis may be the same as or different from the thickness of the second and/or third magnetic elements. One or more of the magnetic elements may be a ferromagnetic element, e.g., a ferromagnetic crystalline grain. In some cases, one or more of the magnetic elements may be a ferromagnetic element, e.g., a ferrimagnetic crystalline grain.

In some cases, the first and/or second magnetic elements are ferromagnetic elements and may comprise a Co based or CoCr based alloy such as CoPt—, CoCr—, CoCrPt—, FePt—X or XY, wherein X and/or Y are metallic or non-metallic, magnetic or nonmagnetic doping elements such as Ni, Cu, Ag, B, $O_2$, C, N. In some cases, the first and/or second magnetic layers may comprise NiFe—, CoFe—, CoNiFe—X or XY, wherein X and/or Y comprise B or Mg. The exchange decoupling material may comprise one or more oxides such as B, Al, Cr, Hg, Mg, Si, Ta, Ti, and Zr oxide, for example. The first and/or second magnetic elements may comprise FePtX or CoPtX with $L1_0$ structure, for example. In some cases, the first and/or second elements comprise ferrimagnetic materials, e.g., PtMn alloys such as $Pt_{10}Mn_{90}$. In some implementations that use hard and soft exchange coupled magnetic elements, PtMn alloys such as $Pt_{10}Mn_{90}$ may be used in a layer disposed adjacent to the soft magnetic element to stabilize the soft magnetic element by antiferromagnetically pinning the soft magnetic element.

The easy axis anisotropy direction for the magnetic elements can lie along the horizontal axis as illustrated in FIGS. 13-15. In some cases the easy axis anisotropy direction can lie along the vertical axis, as illustrated in FIGS. 10-12 and 16. In some implementations, the coupled sets are homogeneous with regard to easy axis direction, wherein all of the magnetic elements in each coupled set have the same easy axis direction. For example, all of the magnetic elements in each coupled set may have vertical easy axis direction as in devices illustrated in FIGS. 10-12 and 16. Alternatively, all of the magnetic elements in each coupled set may have horizontal easy axis direction as illustrated in FIGS. 13 and 14.

In other implementations, the coupled sets are heterogeneous with respect to easy axis anisotropy direction wherein the first magnetic elements in a coupled set have a first easy axis anisotropy direction and the second magnetic elements in the coupled set have a second easy axis anisotropy direction. For example, in FIG. 15, the easy axis direction of first magnetic elements 1511 is along the vertical axis and the easy axis direction of the second magnetic elements 1512 is along the horizontal axis.

Figure 17:
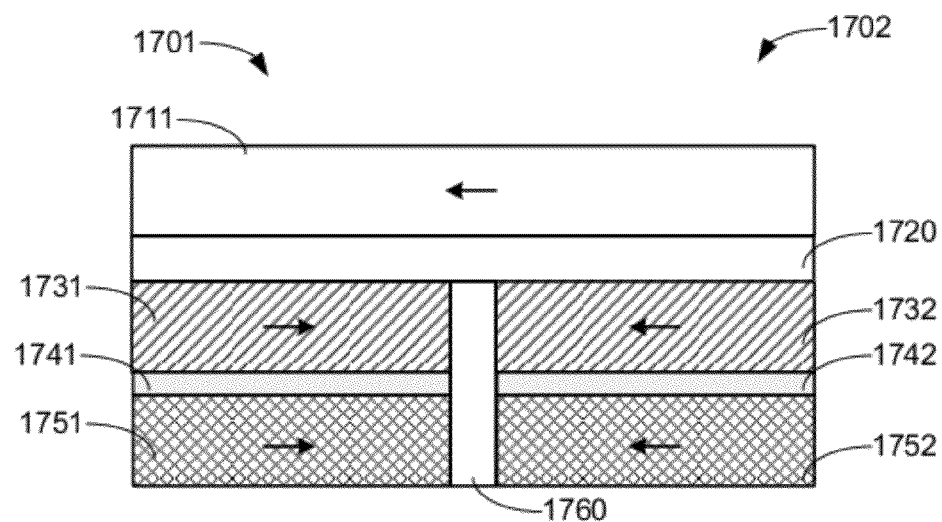
FIG. 17 illustrates a parallel multi level MRAM device in accordance with some embodiments.

In some implementations, magnetoresistive random access memory cells may be capable of storing more than one bit of information in a single cell that is selected by one transistor. These devices are denoted multi level cells (MLC). Two bit MLC can be achieved MTJ cells that switch at different write currents and have multiple read resistance levels. In some configurations, as illustrated in FIG. 17, the MLC MRAM may be a parallel MLC device which operates as two parallel MTJs. A parallel MLC MRAM includes a two MTJ structures 1701, 1702 arranged in a plane. Each of the MTJ structures may share a pinned reference layer 1711 and a barrier layer 1720. The MLC MRAM includes two free layers that comprise exchange coupled sets. Each of the exchange coupled sets includes a first magnetic element 1731, 1732, an exchange coupling layer 1741, 1742, and a second magnetic element 1751, 1752 which is exchange coupled to the first magnetic element 1731, 1732. The first and second magnetic elements are separated from one another by a magnetically decoupling structure 1760, which may be an oxide layer, for example. Any of the exchange coupled sets discussed herein may be used as the free layers in various embodiments of MLC MRAM.

Figure 18:
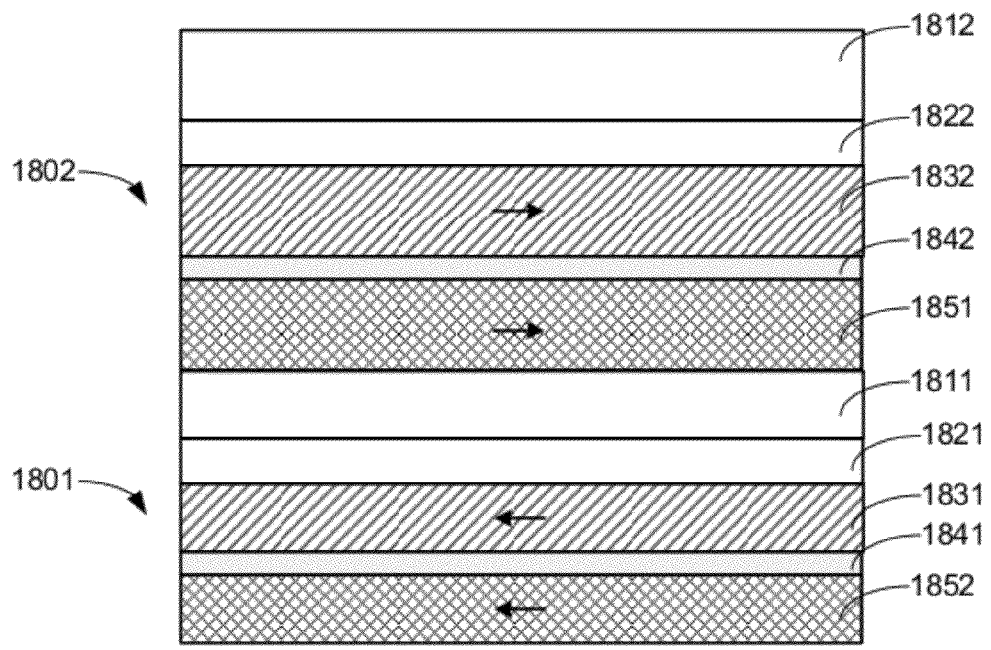
FIG. 18 shows a vertically stacked multi level MRAM device in accordance with some embodiments.

An MLC MRAM may be a serial structure, as illustrated in FIG. 18. The serial MLC MRAM comprises two stacked MTJ structures 1801, 1802. The stacked MTJs 1801, 1802 have reference layers 1811, 1812 that may have different thicknesses and/or composition from one another. Barrier layers 1821 1822 separate the reference layers 1811, 1812 from free layers. The free layers that may have different thicknesses and/or composition from one another. In this configuration, the free layers comprise first and second exchange coupled magnetic elements 1831, 1832, 1851, 1852 separated by exchange coupling layers 1841, 1842.

One or more of the composition, thickness and/or deposition conditions of the exchange coupling layer can be used to control the type of exchange coupling and the amount of exchange coupling between the magnetic elements of a coupled set, as quantified by the exchange coupling interaction parameter, $h_{ex}$. In some implementations, an exchange coupling layer is used that facilitates direct ferromagnetic exchange coupling between the first and second elements, as shown in FIGS. 10, 12, and 14-16. In these implementations, the exchange coupling layer can have a thickness of in a range between about 0 (no exchange coupling layer) to about 30 nm and can comprise magnetic materials such as CoFe, CoPt, FePt or CoNi. The exchange coupling layer may comprise non-magnetic materials such as MgO, MgO—Cu, MgO—Mg, $TiO_4$, $Al_2O_3$, Mg, Ag, Cu, for example.

Figure 11:
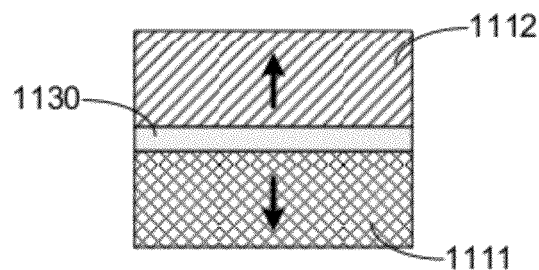

In some cases, the exchange coupling layer provides anti-ferromagnetic coupling between the first and second magnetic layers, as illustrated by FIGS. 11, 13, and 16. In these implementations, the exchange coupling layer can have a thickness of in a range between about 0 (no exchange coupling layer) to about 30 nm and can comprise materials such as Ru.

The materials used for the exchange coupling layer may also provide a template for growth of subsequently grown magnetic elements, in addition to providing exchange tuning the exchange coupling between the magnetic elements.

Exchange coupling memory elements to achieve the constraints of a predetermined long term thermal stability and/or predetermined switching current and/or SCD may also be used in conjunction with magnetically switched MRAM (MMRAM). MMRAM uses a selection matrix to addressably access the MMRAM devices. An MMRAM cell comprises a layered structure including a reference magnetic layer and a magnetically switched free magnetic layer coupled to a selection circuit.

Figure 19A:
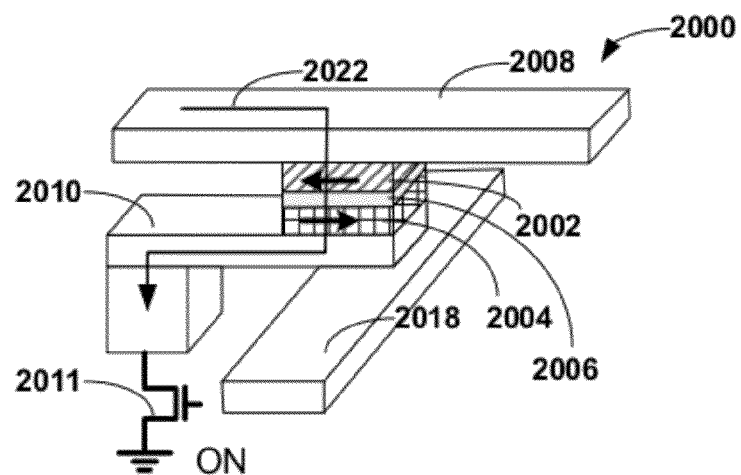
FIGS. 19A and 19B illustrate the read and write operations of a magnetoresistive random access memory cell having a free layer including exchange coupled elements, in accordance with some embodiments.
Figure 19B:
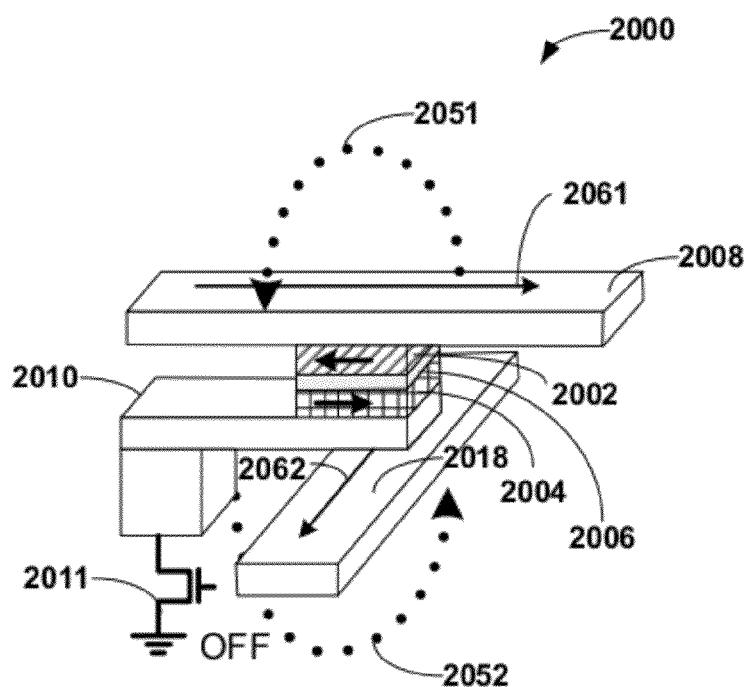

FIGS. 19A and B illustrate the operation of the MMRAM cell 2000 which can include a free layer comprising exchange coupled magnetic elements. MMRAM cell 2000 includes a free magnetic layer 2002, a reference magnetic layer 2004 and a barrier layer 2006 between the free layer 2002 and the reference layer 2004. Electrical contact is made to the MRAM cell 2000 by a top electrical contact layer 2008 and a bottom electrical contact layer 2010. FIGS. 19A and 19B illustrate read and write operations, respectively, for the MMRAM cell 2000. The MMRAM cell 2000 is connected to selection transistor 2011. As illustrated by FIG. 19A, when the MRAM cell is read, then selection transistor 2011 is on causing a read current 2022 to flow through the MMRAM cell 2000. The resistance of the MMRAM device is determined to be either low or high depending on the magnetization orientation of the free layer 2002 relative to the pinned layer 2004. As illustrated by FIG. 19B, when the MMRAM cell 2000 is written to, the selection transistor 2011 is off. The combination of two orthogonal magnetic fields 2051, 2052, induced by currents 2061, 2062 in orthogonal conductors 2008, 2018 can cause the magnetic orientation of the free layer 2002 to flip from one state to another.

MMRAM cells face similar scaling challenges as SPRAM. Shrinking device sizes may concurrently involve switching at lower currents and/or decreased SCD and maintaining the long term thermal stability of the memory. In the case of MMRAM, the switching current and SCD is the current through the orthogonal wires 2008, 2018.

In some implementations, the magnetic switching may be assisted by heating the magnetic layers of the MMRAM cell to decrease the magnetic field to write to the device. In some designs, a relatively low Curie temperature ferromagnetic material, e.g., a Curie temperature of about 500 K as opposed to a Curie temperature of about 1200 K used for non-thermally assisted implementations, may be used as the storage layer. The cell is heated close to the Curie temperature and a magnetic field is generated by the digit line sets the write direction.

Figure 19C:
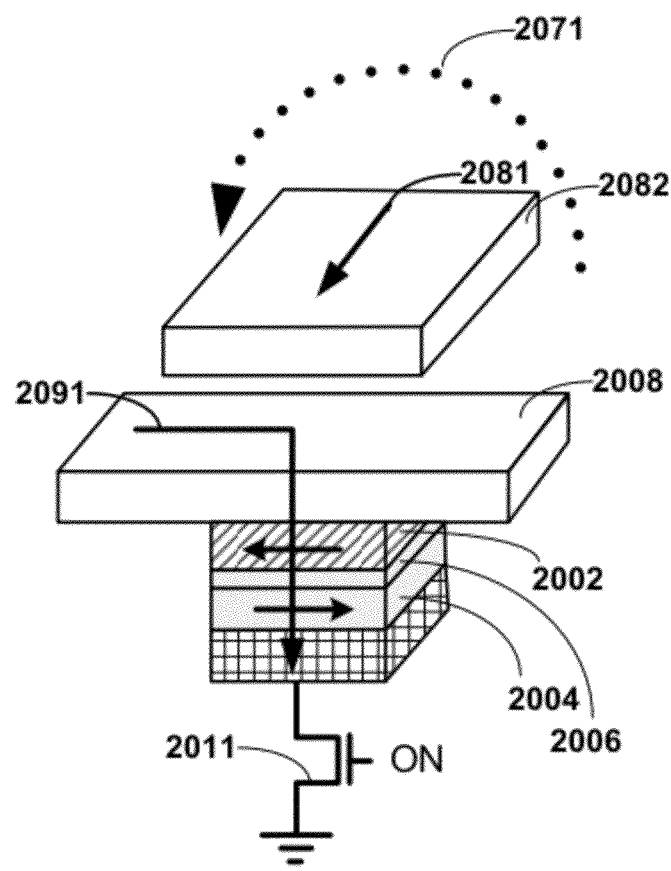
FIG. 19C illustrates a heat assisted MRAM write operation in an MRAM device having a free layer including exchange coupled elements in accordance with some embodiments.

Thermally assisting the writing process of a MMRAM cell may involve circulating a current in the write lines of the device to heat the device above a write temperature to reduce the magnetic write field to switch the device from one state to another. Another approach that involves heating the device directly with current flow through the device and also electrically assisting the writing process is illustrated in FIG. 19C. The device illustrated in FIG. 19C may be a hybrid MMRAM/SPRAM device which includes an exchange coupled free layer as described herein, wherein both the magnetic field 2071 generated by the current 2081 flowing in wire 2082 and the spin torque effect of current 2091 flowing through the device operate together to switch the magnetization state of the free layer. In this implementation, the selection transistor 2011 is turned on during the write operation allowing a current 2091 to flow through the device which additionally provides Joule heating in the metallic layers and heating due to tunneling electrons.

Non-hybrid SPRAM implementations can also make use of joule heating in devices that use relatively low Curie temperature and higher coercivity free layers. The use of joule heating in SPRAM, MMRAM, and hybrid applications can be used to decrease the switching current while achieving a long term thermal stability at the storage temperature.

Various approaches and structures involving exchange coupled magnetic elements that may be implemented in MTJ devices as described herein are further discussed in commonly owned U.S. Pat. No. 8,481,181, which is incorporated herein by reference in its entirety.

Figure 20:
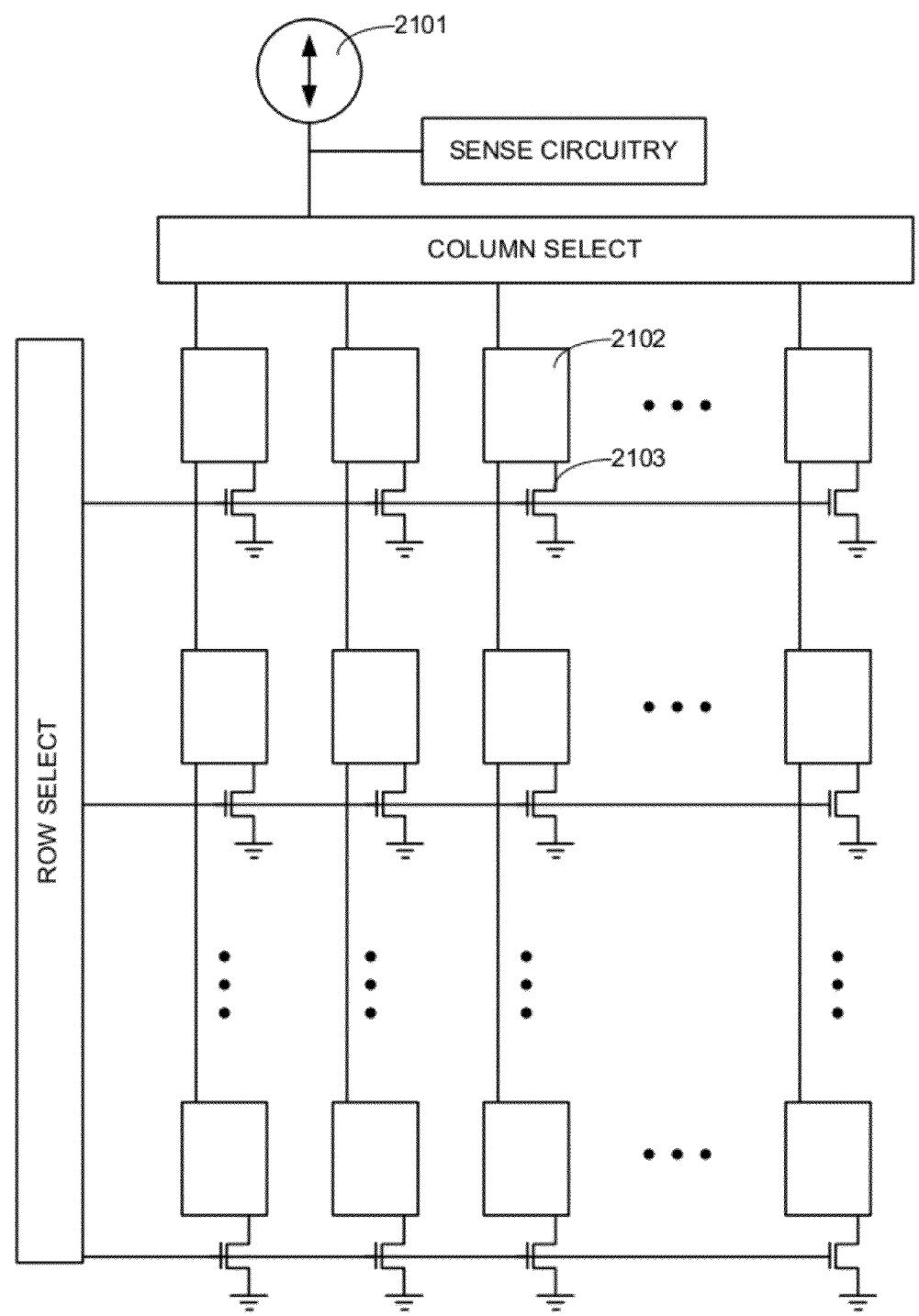
FIG. 20 is a memory system that includes an array of magnetic tunnel junction memory cells according to some embodiments.

FIG. 20 illustrates an array of magnetic tunnel junction devices 2102 described herein arranged in a memory system. The system includes selection circuitry including row and column selection circuitry configured to select one of the magnetic tunnel junction devices. The selection circuitry can be configured to activate a particular selection transistor 2103 and/or to couple a particular device to a current supply 2101. The system also includes circuitry configured to sense the data stored in the selected device and to store data in the selected device.

The foregoing description of various embodiments has been presented for the purposes of illustration and description and not limitation. Embodiments described can be practiced throughout the disclosed numerical ranges. The examples provided are not intended to be exhaustive or to limit the possible implementations to the embodiments disclosed. Many modifications and variations are possible in light of the above teaching.

The invention claimed is:

1. A magnetic tunnel junction device, comprising:
a magnetic reference layer; and
a magnetic free layer comprising:
a first magnetic element having a first saturation magnetization, $M_{s1}$, and anisotropy, $H_{k1}$;
a second magnetic element having a second saturation ma magnetization, $M_{s2}$ and anisotropy, $H_{k2}$, that is magnetically exchange coupled to the first magnetic element, wherein magnetic exchange coupling between the first and second magnetic elements is configured to achieve a switching current distribution less than about 200% and a long term thermal stability criterion of greater than about 60 $k_B T$, and the ratio $M_{s2}H_{k2}M_{s1}H_{k1}$ is less than about 0.8.

2. The device of claim 1, wherein an exchange interaction parameter, hex $=J/M_{s2}H_{k1}$ is less than 0.65, where J is the exchange coupling strength between the first and second elements.

3. The device of claim 1, wherein:
the second magnetic element comprises CoPt or CoCrPt or CoCr; and
the first magnetic element comprises FePt or CoPt with $L1_0$ structure.

4. The device of claim 1, wherein the device comprises a multi level storage device having two magnetic tunnel junctions arranged in parallel.

5. The device of claim 1, wherein the device comprises a multi level storage device having two magnetic tunnel junctions arranged in series.

6. The device of claim 1, wherein an anisotropy of the first magnetic element is less than an anisotropy of the second magnetic element.

7. The device of claim 1, wherein a volume of the first magnetic element is less than a volume of the second magnetic element.

8. The device of claim 1, further comprising an exchange coupling layer disposed between the first and second magnetic elements.

9. The device of claim 8, wherein the exchange coupling layer is configured to achieve antiferromagnetic coupling between the first and second magnetic elements.

10. A magnetic tunnel junction device, comprising:
a magnetic reference layer; and
a magnetic free layer comprising:
a first magnetic element;
a second magnetic element, and
an exchange coupling layer disposed between the first magnetic element and the second magnetic element, the exchange coupling layer configured to control an amount of exchange coupling between the first and second magnetic elements, the exchange coupling between the first and second magnetic elements configured to achieve a predetermined switching current, a predetermined switching current distribution, and a long term thermal stability criterion, wherein an exchange interaction parameter, hex=$J/M_{s2}/H_{k1}$ is less than 0.65, where J is the exchange coupling strength between the first and second elements.

11. The device of claim 10, wherein the exchange coupling layer is configured to provide antiferromagnetic coupling between the first and second magnetic elements and comprises Ru.

12. The device of claim 10, wherein the exchange coupling layer comprises one or more of MgO, Mg, and Ag.

13. The device of claim 10, wherein at least one of first and second magnetic elements is a ferrimagnetic material and comprises PtMn.

14. The device of claim 10, wherein the switching current distribution of the device is less than about 50%.

15. The device of claim 10, wherein the switching current distribution of the device is less than about 200%.

16. The device of claim 10, wherein the long term thermal stability criterion is about 60 $k_B T$.

17. The device of claim 10, wherein the first magnetic element and the second magnetic element have about the same aspect ratio and the first magnetic element has a different volume than the second magnetic element.

18. The device of claim 10, wherein the anisotropy of at least one of the first and second magnetic elements is less than about 200,000 Oe.

19. The device of claim 10, wherein the first magnetic element has a magnetization easy axis that is parallel to a magnetization easy axis of the second magnetic element.

20. A system, comprising:
an array of magnetic tunnel junction devices, each magnetic tunnel junction device comprising:
a magnetic reference layer;
a magnetic free layer comprising:
a first magnetic element having a first saturation magnetization, $M_{s1}$, and anisotropy, $H_{k1}$;
a second magnetic element having a second saturation ma magnetization $M_{s2}$ and anisotropy, $H_{k2}$, that is magnetically exchange coupled to the first magnetic element, wherein magnetic exchange coupling between the first and second magnetic elements is configured to achieve a switching current distribution less than about 200% and a long term thermal stability criterion of greater than about 60 $k_B T$ and the ratio $M_{s2} H_{k2}/M_{s1} H_{k1}$ is less than about 0.8 ;

circuitry configured to select a particular magnetic tunnel junction device for access; and circuitry configured store or read data to or from the selected magnetic tunnel junction device.

* * * * *

UNITED STATES PATENT AND TRADEMARK OFFICE
CERTIFICATE OF CORRECTION

PATENT NO. : 8,742,518 B2  
APPLICATION NO. : 13/077948  
DATED : June 3, 2014  
INVENTOR(S) : Xiaobin Wang and Kaizhong Gao Page 1 of 1

It is certified that error appears in the above-identified patent and that said Letters Patent is hereby corrected as shown below:

In the Claims:

Column 11, line 48, Claim 1: "ma magnetization, $M_{s2}$ and anisotropy, $H_{k2}$, that is" should read —magnetization, $M_{s2}$ and anisotropy, $H_{k2}$, that is—.

Column 11, line 55, Claim 1: "$M_{s2}H_{k2}M_{s1}H_{k1}$ is less than about 0.8." should read —$M_{s2}H_{k2}/M_{s1}H_{k1}$ is less than about 0.8.—.

Column 11, line 57, Claim 2: "parameter, hex = $J/M_{s2}H_{k1}$ is less than 0.65, where J is the" should read —parameter, hex = $J/M_{s2}/H_{k1}$ is less than 0.65, where J is the—.

Column 12, line 65, Claim 20: "a second magnetic element having a second saturation ma" should read —a second magnetic element having a second saturation—.

Signed and Sealed this  
Ninth Day of September, 2014

Michelle K. Lee  
*Deputy Director of the United States Patent and Trademark Office*